United States Patent
Stern et al.

(10) Patent No.: US 7,539,929 B1
(45) Date of Patent: May 26, 2009

(54) ERROR CORRECTION FOR DATA COMMUNICATION

(75) Inventors: Ulrich Stern, Palo Alto, CA (US);
Joseph I. Chamdani, Santa Clara, CA (US); Yu Fang, Sunnyvale, CA (US);
Liuxi Yang, Sunnyvale, CA (US)

(73) Assignee: Brocade Communications Systems, Inc., San Jose, CA (US)

( * ) Notice: Subject to any disclaimer, the term of this patent is extended or adjusted under 35 U.S.C. 154(b) by 549 days.

(21) Appl. No.: 11/154,886

(22) Filed: Jun. 15, 2005

Related U.S. Application Data

(62) Division of application No. 10/119,224, filed on Apr. 8, 2002, now Pat. No. 6,920,601.

(51) Int. Cl.
*H03M 13/00* (2006.01)
*G06F 11/00* (2006.01)

(52) U.S. Cl. .................................. 714/785; 714/701

(58) Field of Classification Search ................ 714/746, 714/785, 759, 799, 701, 737, 738
See application file for complete search history.

(56) References Cited

U.S. PATENT DOCUMENTS

| | | | | |
|---|---|---|---|---|
| 3,568,148 | A | 3/1971 | Clark, Jr. ..................... | 714/785 |
| 4,388,684 | A | 6/1983 | Nibby et al. .................. | 714/52 |
| 4,486,882 | A | 12/1984 | Piret et al. .................. | 714/788 |
| 4,775,979 | A | 10/1988 | Oka ........................... | 714/761 |
| 4,939,733 | A | 7/1990 | Furutani ..................... | 714/765 |
| 5,010,554 | A | 4/1991 | Bechtel et al. ............... | 714/759 |
| 5,166,977 | A | 11/1992 | Ross | |
| 5,425,038 | A | 6/1995 | Chen | |
| 5,428,617 | A | 6/1995 | Urushima | |
| 5,563,894 | A | 10/1996 | Fujiwara et al. .............. | 714/785 |
| 5,745,507 | A | 4/1998 | Chen .......................... | 714/763 |
| 5,841,795 | A | 11/1998 | Olarig et al. ................ | 714/768 |
| 5,907,564 | A | 5/1999 | Jachijms et al. | |
| 5,922,080 | A | 7/1999 | Olarig ........................ | 714/767 |
| 6,536,009 | B1 | 3/2003 | Bodnar ........................ | 714/762 |
| 6,539,513 | B1 * | 3/2003 | Chen .......................... | 714/758 |
| 6,625,774 | B1 | 9/2003 | Yang | |
| 6,691,278 | B1 * | 2/2004 | Patapoutian et al. ......... | 714/801 |

(Continued)

FOREIGN PATENT DOCUMENTS

JP 58-205260 11/1983

OTHER PUBLICATIONS

Marshall, J.W., "Error Correction Apparatus" IBM Technical Disclosure Bulletin, Sep. 1, 1974, pp. 974-976.

(Continued)

*Primary Examiner*—Phung M Chung
(74) *Attorney, Agent, or Firm*—Hensley Kim & Holzer, LLC

(57) ABSTRACT

Generating a check matrix includes defining a generator function operable to yield check bits associated with a word. A set of primitive elements is calculated from the generator function. A set of check matrix columns is generated, where each check matrix column includes a matrix having a subset of the set of primitive elements. A check matrix is generated from a subset of the set of check matrix columns, where the check matrix yields a syndrome that comprises an error pattern for the word. The check matrix is reported.

20 Claims, 10 Drawing Sheets

U.S. PATENT DOCUMENTS

| | | |
|---|---|---|
| 6,718,508 B2 | 4/2004 | Lodge et al. |
| 6,920,588 B1 | 7/2005 | Yang et al. |
| 6,920,601 B1 | 7/2005 | Stern et al. |
| 6,968,491 B1 * | 11/2005 | Yang et al. .................. 714/752 |
| 2002/0083391 A1 | 6/2002 | Huggett et al. |
| 2002/0157059 A1 | 10/2002 | Gregori et al. |
| 2002/0188906 A1 | 12/2002 | Kurtas et al. |
| 2003/0037298 A1 | 2/2003 | Eleftheriou et al. |
| 2003/0046635 A1 | 3/2003 | Murillo et al. |

OTHER PUBLICATIONS

Shi, Y.Q., et al., "Interleaving for Combating Bursts of Errors" IEEE Circuits and Systems Magazines, vol. 4, Issue 1, First Quarter 2004, pp. 29-42.

* cited by examiner

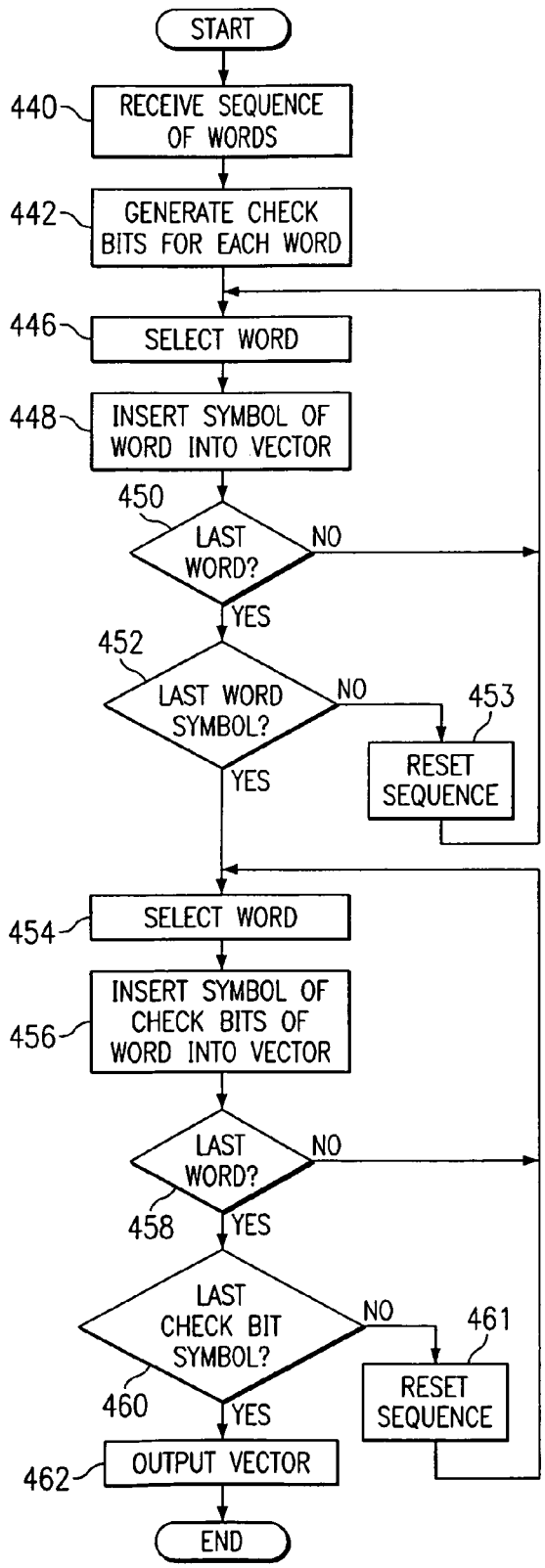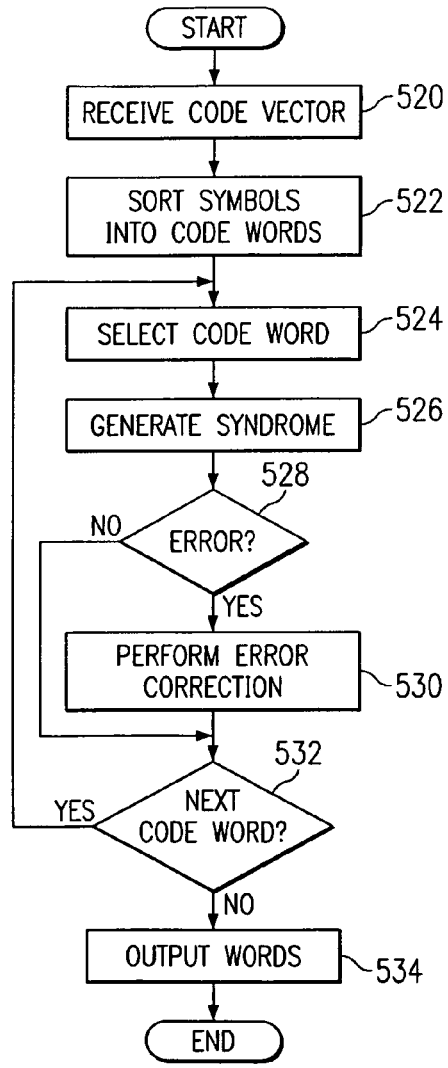

US 7,539,929 B1

ERROR CORRECTION FOR DATA COMMUNICATION

RELATED APPLICATIONS

This application is a divisional of U.S. patent application Ser. No. 10/119,224 filed Apr. 8, 2002, now U.S. Pat. No. 6,920,601 entitled "ERROR CORRECTION FOR DATA COMMUNICATION,".

TECHNICAL FIELD OF THE INVENTION

This invention relates generally to the field of data communication and more specifically to error correction for data communication.

BACKGROUND OF THE INVENTION

Transmitted data may undergo changes that result in errors in the data. Error correction and error detection techniques are used to detect and correct errors in transmitted data. Error correction and error detection techniques, however, often require a relatively large amount of processing time and bandwidth. Moreover, error correction and error detection techniques are typically limited to detecting and correcting errors in a small amount of data. Consequently, error correction and error detection techniques are unsuitable for many needs.

SUMMARY OF THE INVENTION

In accordance with the present invention, disadvantages and problems associated with previously developed techniques are substantially eliminated or reduced.

According to one embodiment of the present invention, generating a check matrix includes defining a generator function operable to yield check bits associated with a word. A set of primitive elements is calculated from the generator function. A set of check matrix columns is generated, where each check matrix column includes a matrix having a subset of the set of primitive elements. A check matrix is generated from a subset of the set of check matrix columns, where the check matrix yields a syndrome that comprises an error pattern for the word. The check matrix is reported.

According to one embodiment of the present invention, error correction includes receiving a code word having a word and check bits, where the word includes symbols. A syndrome that has an error pattern is generated from the check bits. A symbol of the word having an error is identified, and the error of the symbol is corrected according to the error pattern.

Certain embodiments of the invention may provide technical advantages. A technical advantage of one embodiment may be that a check matrix may yield a syndrome that includes an error pattern of an error in transmitted data. Including the error pattern in the syndrome may eliminate the need to search for the error pattern in a lookup table, which may provide for more efficient error correction. Another technical advantage of one embodiment may be that a check matrix may yield a syndrome for which only a portion of a syndrome is needed to identify the location of an error. Using only a portion of the syndrome may reduce the size of a lookup table listing the possible locations of an error, which may provide for more efficient error detection.

Other technical advantages are readily apparent to one skilled in the art from the following figures, descriptions and claims. Embodiments of the invention may include none, some, or all of the technical advantages.

BRIEF DESCRIPTION OF THE DRAWINGS

For a more complete understanding of the present invention and for further features and advantages, reference is now made to the following description, taken in conjunction with the accompanying drawings, in which:

FIG. 10 is a flowchart illustrating one example of a method for generating a vector from a serial sequence of words that may be used with the system of FIG. 8;

FIG. 13 is a flowchart illustrating one example of a method for generating words from a vector that may be used with the system of FIG. 10.

DETAILED DESCRIPTION OF THE DRAWINGS

Figure 1:
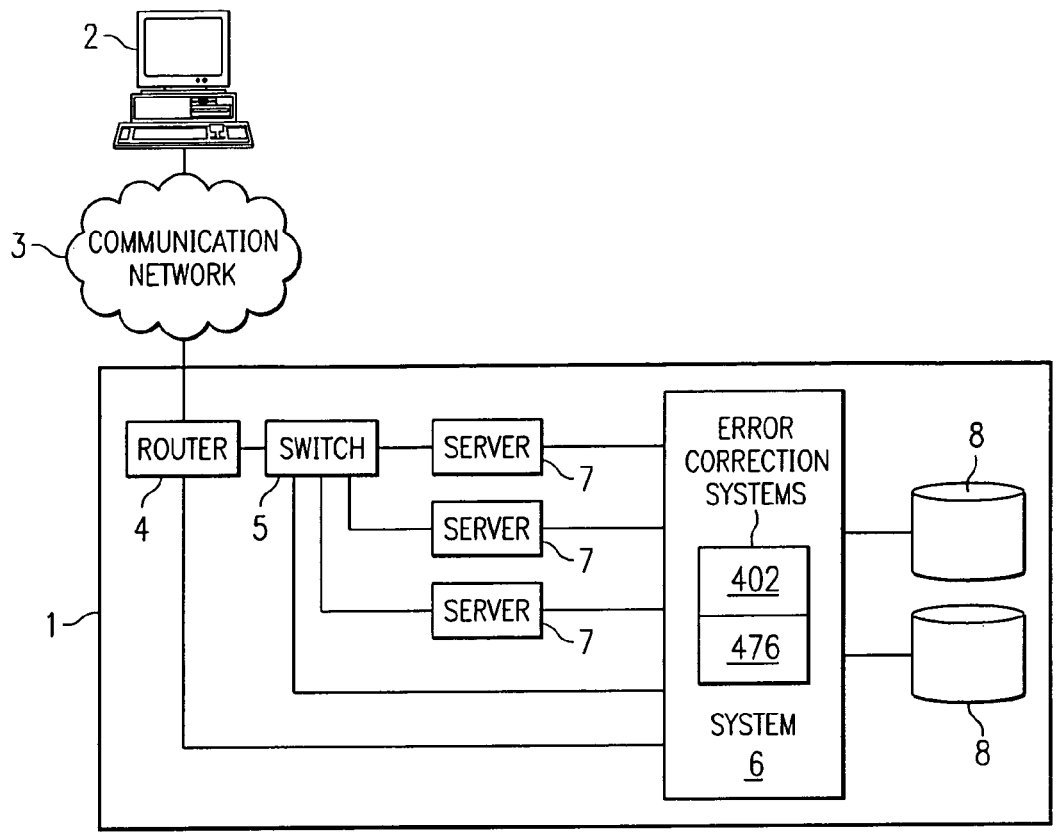
FIG. 1 is a block diagram illustrating one example of a system area network for communicating and storing data.

FIG. 1 is a block diagram illustrating one example of a system area network 1 for communicating and storing data. System area network 1 provides for the communication and storage of data, and provides error correction and error detection capabilities for communicated data.

One or more remote devices 2 communicate with system area network 1 through a communications network 3. Remote devices 2 may include appropriate input devices, output devices, storage media, processors, memory, or other devices for receiving, processing, storing, and communicating data. Communications network 3 may include a public switched telephone network (PSTN), a public or private data network, the Internet, a wired or wireless network, a local, regional, or global communications network, or any other network suitable for communicating data to system area network 1. Communications network 3 communicates data to a router 4, which in turn may communicate data to a switch 5 or to a system 6 for processing data packets. Switch 5 may communicate data to one or more servers 7 or to system 6.

System 6 stores and retrieves data in one or more databases 8. System 6 may comprise logic encoded in any suitable media such as hardware, firmware, or software or any combination of the preceding. System 6 includes error correction systems 402 and 476 that provide error correction and error detection for data transmitted to databases 8. Error correction system 402 transmits data, and error correction systems 476 receives data.

In system area network 1, data $[d_1 \ d_2 \ \ldots \ d_n]$ may be transmitted as words. To detect errors that may have occurred during transmission, error correction system 402 calculates check bits $[p_1 \ p_2 \ \ldots \ p_m]$ for each word using a generator matrix $G=[I:A]$ comprising an identity matrix I and a generation matrix A. "Each" as used in this document refers to each member of a set or each member of a subset of the set. A code word comprising the data and the check bits may be generated according to $[d_1\ d_2\ \ldots\ d_n] \times G = [d_1\ d_2\ \ldots\ d_n\ p_1\ p_2\ \ldots\ p_m]$.

A transmitted code word is received at error correction system 476 as received code word W. A syndrome Syn is calculated from the check bits using a check matrix $H=[A^T:I]$ according to Syn=H×W. Syndrome Syn is used to detect and correct errors that may have occurred during the transmission. Syndrome Syn may include an error pattern that is used to correct an error. System and methods for generating check matrix H are described in reference to FIGS. 2 through 6.

System 6 may perform 8b/10b conversion, and error correction systems 402 and 476 may provide error detection and error correction capabilities compatible with 8b/10b conversion. Systems 402 and 476 may correct up to sixteen consecutive bit errors, or up to twenty consecutive bit errors after 8b/10b encoding, and may detect double sixteen bit errors at random locations. Systems 402 and 476 and methods for providing error detection and error capabilities are described in more detail with reference to FIGS. 7 through 10.

System 6 provides error correction and detection capabilities that may be used with 8b/10b conversion. 8b/10b conversion is used in digital communication to achieve direct current (DC) balanced data transmission lines. DC balanced data transmission lines have a direct current that is zero, that is, the number of 1's is equal to the number of 0's. For a serial digital data link, data transmission lines are typically required to be DC balanced in order to maintain the correctness of data transmission. At the transmission side, 8b/10b encoding encodes 8 bits of information data into 10 bits of transmission data. At the receiving side, the 10 bits of transmission data is recovered as the 8 bits of information data.

8b/10b encoding, however, may pose problems for error detection and correction. To protect the transmission channel from noise, error correction code is typically added to data before the data is inserted into a data transmission line. Error correction code, however, typically cannot maintain an equal number of 1's and 0's. Consequently, error correction code cannot be added to 8b/10b encoded data without defeating the purpose of the 8b/10b encoding.

8b/10b encoding may be included inside of the error correction code to allow for DC balanced transmission lines. Known single bit error correction code techniques, however, cannot be used in such a manner. First, a single bit error introduced during data transmission may result in a multi-bit error after data is recovered due to the 8b/10b encoding. A multi-bit error is not detectable using known single bit error correction code techniques. Second, known single bit error correction code techniques typically cannot identify a specific 8b/10b word of adjacent 8b/10b words that has an error. System 6 performs a method that overcomes these difficulties by providing the ability to detect and correct multi-bit errors of a specific 8b/10b word of adjacent 8b/10b words.

Single Bit Error Correction and Double Bit Error Detection

Figure 2:
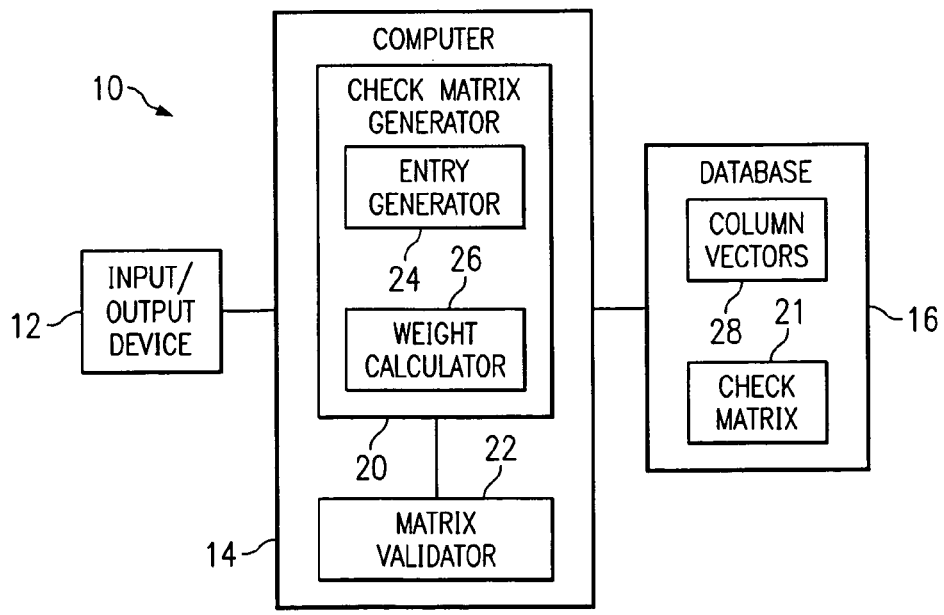
FIG. 2 is a block diagram illustrating one example of a system for generating a check matrix for error correction and error detection.

FIG. 2 is a block diagram illustrating one example of a system 10 for generating a check matrix for error correction and error detection. System 10 includes an input/output device 12, a computer 14, and a database 16. Input/output device 12 may comprise any suitable device for providing information to and/or receiving information from computer 14 such as a display, a keyboard, or a mouse. As used in this document, the term "computer" refers to any suitable device operable to accept input, process the input according to predefined rules, and produce output, for example, a personal computer, workstation, network computer, wireless data port, wireless telephone, personal digital assistant, one or more processors within these or other devices, or any other suitable processing device.

Computer 14 includes a check matrix generator 20 and a matrix validator 22. Check matrix generator 20 generates a check matrix 21 that is used to calculate a syndrome that may be used to detect errors in a transmitted word. Check matrix 21 may be stored in database 16. Check matrix generator 20 includes an entry generator 24 and a weight calculator 26. Entry generator 24 generates the entries of check matrix 21. Each entry may comprise a submatrix. Entry generator 24 may use column vectors 28 stored in database 16 to generate the entries. Weight calculator 26 calculates the weight of an entry, which may be defined as the number of non-zero entries of the submatrix of the entry. Entry generator 24 uses weight calculator 26 to determine minimum weight entries that may be used for check matrix 21. Matrix validator 22 is used to validate check matrix 21 generated by check matrix generator 20.

Figure 3:
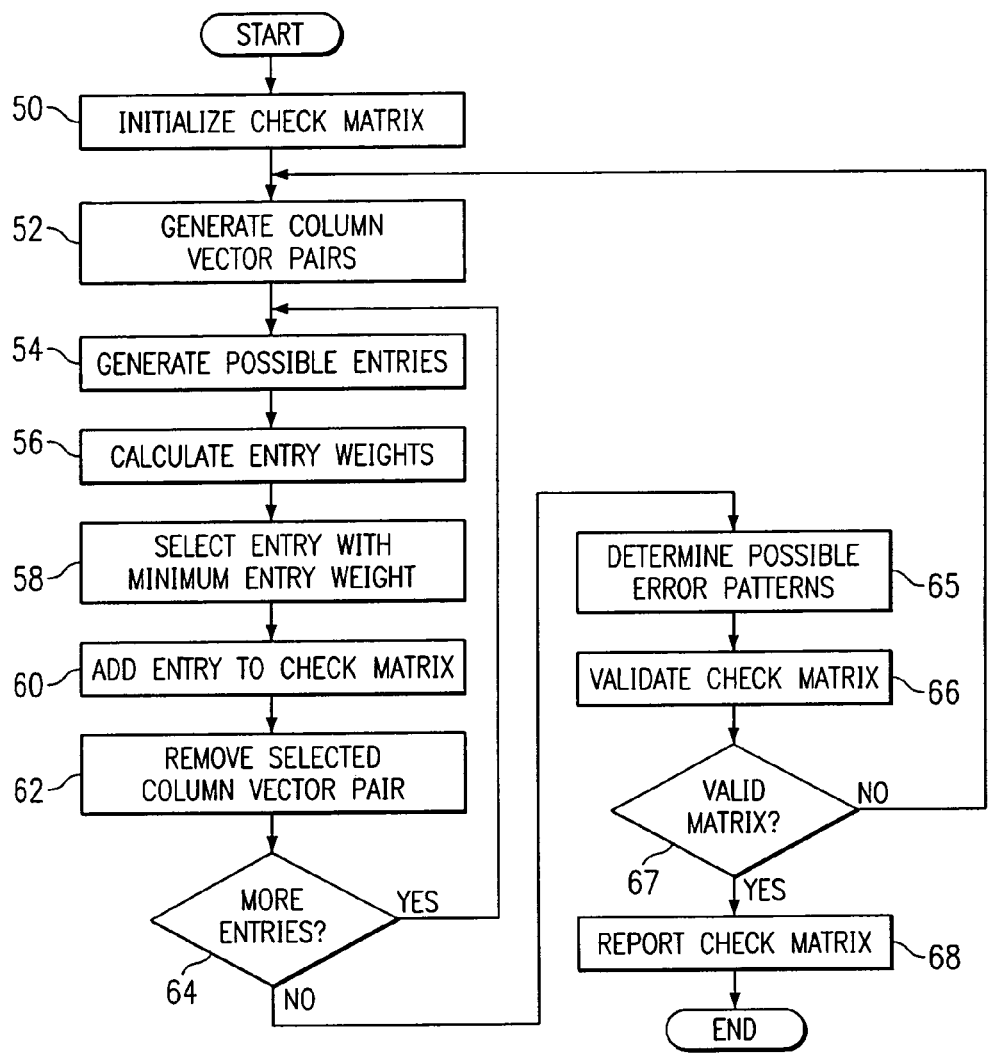
FIG. 3 is a flowchart illustrating one example of a method for generating a check matrix that may be used with the system of FIG. 2.

FIG. 3 is a flowchart illustrating one example of a method for generating a check matrix H that may be used with system 10 of FIG. 2. Check matrix H provides single bit error correction and double bit error correction capabilities. In the example, r represents the number of check bits, where r is a positive even number. The code length is $2^{r-1}-2^{r/2}$.

The begins at step 50, where check matrix generator 20 initializes check matrix H. Check matrix H may be defined according to a Kaneda code using Equation (1):

$$H=\lfloor h_{01}\ h_{02}\ \ldots\ h_{ij}\ \ldots \rfloor \qquad (1)$$

The entries $h_{ij}$ of check matrix H may be defined using Equation (2):

$$h_{ij} = \begin{bmatrix} g \oplus f_i \oplus f_j \oplus g \oplus f_i \oplus f_j & f_i & f_j \\ f_i & f_j & g \oplus f_i \oplus f_j g \oplus f_i \oplus f_j \end{bmatrix} \qquad (2)$$

Vector g is an arbitrary column vector with r/2 binary elements. For example, the entries of vector g may comprise ones, which may reduce the weight of check matrix H. Vector $f_q$ is defined as a column vector having r/2 binary elements. The weight of vector $f_q$ may be odd, if the weight of vector g is even. The number of vectors $f_q$ is $2^{r/2-1}$, where q=0, 1, ..., $2^{r/2-1}-1$.

Subsets, for example, pairs of column vectors ($f_i$, $f_j$) are generated at step 52 and inserted into a vector F, which is stored in database 16. Possible entries $h_{ij}$ of check matrix H are generated from the column vector pairs by entry generator 24 at step 54. Equation (2) may be used to generate entry $h_{ij}$. The weights of the generated entries $h_{ij}$ are calculated by weight calculator 26 at step 56. An entry $h_{ij}$ with a minimum entry weight is selected at step 58. At step 60, the selected entry $h_{ij}$ is added to check matrix H. The selected column vector pair ($f_i$, $f_j$) is removed from vector F at step 62.

At step 64, check matrix generator 20 determines whether check matrix H requires more entries $h_{ij}$. If more entries $h_{ij}$ are required, the method returns to step 54 to generate possible entries $h_{ij}$. If no more entries $h_{ij}$ are required, the method proceeds to step 65. At step 65, check matrix generator 20 determines possible error patterns, for example, possible single bit error correction double bit error detection error patterns.

Matrix validator 22 validates the check matrix H at step 66. Validation may involve verifying that check matrix H can be used to detect the errors described by the error patterns. If check matrix H is not valid at step 67, the method returns to step 52, where pairs of column vectors ($f_i$, $f_j$) are generated. If check matrix H is valid, the method proceeds to step 68. The check matrix H is outputted at step 68. After outputting the check matrix H, the method terminates.

An example check matrix H generated according to the method is described. Example check matrix H comprises a ten row matrix. Due to space limitations, a row of check matrix H may occupy more than one line of text.

| Row | Entries |
|---|---|
| 1 | 10001000111111111111000100010001000111110001000001100110011100000111000100011100111000001111111000100010001000100010001000100010001000000000 |
| 2 | 11101001000001100110100111110001111100001000011100000110011001111110100100000110011100000110011010000110100010000110100001110000100000000 |
| 3 | 10000011001111111000111110000011001101001111010000111000100011100010001000001111110100100010000011001101000011010010000100001100100000000 |
| 4 | 11111111100010001111010010001111001101001000111110001000010000110011111101001000100010001111001101000100001110000100001111000010000001000000 |
| 5 | 00110011111110001000100010011110100010010000011001100111111010010010001111010010011101010001001000111110000100100001000100001000000100000 |
| 6 | 00100010111111111111001000100010001011110010001011011001100001011000010001011111100001011001111001000100010001000100001000100001000100000010000 |
| 7 | 11110001001011001000001111100101111001000011100001011001100110011110001001011001100001011001100000011100000010001110000010000001000000001000 |
| 8 | 00101100110011110010111100101100100000111110001110000100010111100100010001100111100010001010110010000011100000100100001110000000000100 |
| 9 | 1111111100100010111100010010111110000100101111001000100001110011001111000100100010001011111100000010001110000100001110001000010000000010 |
| 10 | 1100110011100100010000100011111100010001001010110011001110010001011111000100001111000100010011110010000010010001001001000010000000001 |

Check matrix H, however, is only an example. Other check matrices H may be generated according to the method.

Single Symbol Error Correction and Double Symbol Error Detection

Figure 4:
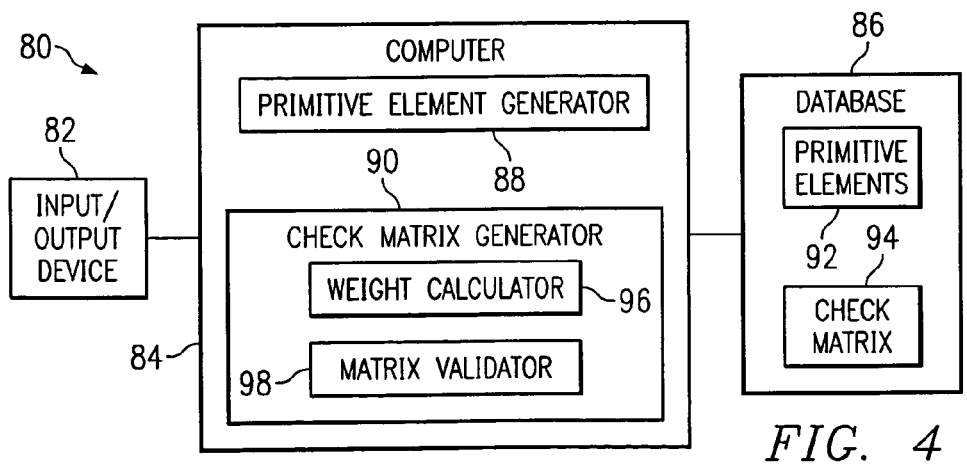
FIG. 4 is a block diagram illustrating one example of a system for generating a check matrix for error correction and error detection.

FIG. 4 is a block diagram illustrating one example of a system 80 for generating a check matrix 94 for error correction and error detection. System 80 includes an input/output device 82, a computer 84, and a database 86. Input/output device 82 may comprise any device suitable for providing information to and/or receiving information from computer 84 such as a display, a keyboard, or a mouse.

Computer 84 includes a primitive element generator 88 and a check matrix generator 90. Primitive element generator 88 generates primitive elements 92 that are used to form check matrix 94. Primitive elements 92 and check matrix 94 may be stored in database 86. Check matrix generator 90 generates check matrix 94 that is used to calculate a syndrome, which is used to detect errors in a transmitted word. Check matrix generator 90 includes a weight calculator 96 and a matrix validator 98. Weight calculator 96 calculates the weight of a check matrix 94, which may be defined as the number of non-zero entries. Check matrix generator 90 uses weight calculator 96 to determine a minimum weight check matrix 94. Matrix validator 98 determines whether a check matrix 94 satisfies error detection and error correction capabilities.

Figure 5:
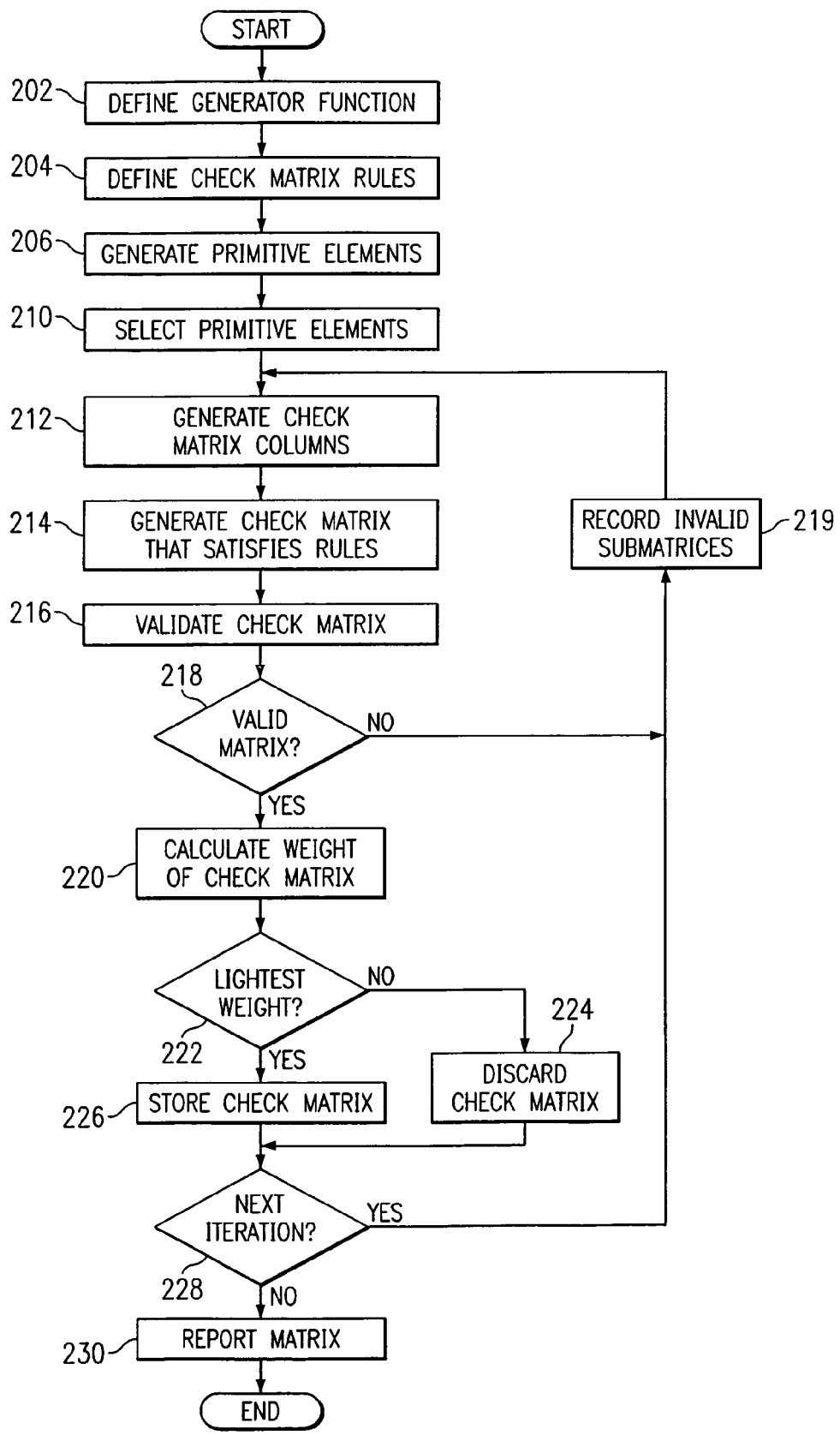
FIG. 5 is a flowchart illustrating one example of a method for generating a check matrix that may be used with the system of FIG. 4.

FIG. 5 is a flowchart illustrating one example of a method for generating a check matrix H that may be used with system 80 of the FIG. 4. Check matrix H provides single symbol error correction and double symbol error detection capabilities that may be used to generate a 160-bit code word.

The method begins at step 202, where a generation function g(x) is defined. The generation function g(x) may be defined by Equation (3):

$$g(x) = x^4 + x + 1 \tag{3}$$

Check matrix rules are defined at step 204. The rules may include, for example:

1. Check matrix H does not include two columns C that are the same;
2. A primitive element $T_i$ is not present in the check matrix H more than twice;
3. Any double error syndrome is a result of an exclusive-or (XOR) operation over two single error syndromes; and
4. A submatrix of check matrix H must satisfy error correction and error detection capabilities, for example, single symbol error correction and double symbol error detection capabilities.

Primitive elements $T_i$ are generated by primitive element generator 88 at step 204. A companion matrix T is defined for generation function g(x). Companion matrix T may be defined using Equation (4):

$$T = \begin{bmatrix} 0 & 0 & 0 & 1 \\ 1 & 0 & 0 & 1 \\ 0 & 1 & 0 & 0 \\ 0 & 0 & 1 & 0 \end{bmatrix} \tag{4}$$

A set F comprising primitive elements $T_i$ is defined according to companion matrix T. Set F may be described by Equation (5):

$$F = \{T_i | i \in 0, 1, 2, \ldots, 14\} \tag{5}$$

where primitive element $T_i$ is defined using Equation (6):

$$T_i = T^i \tag{6}$$

In the illustrated example, the matrices of set F and the zero matrix form a Galois field, and the matrices of set F form an ideal ring on the Galois field.

Primitive elements $T_i$ are selected by check matrix generator 90 at step 210. Check matrix columns C are generated at step 212. Check matrix H includes check matrix columns C that are the rotations of the columns as defined by Equation (7):

$$C = \begin{bmatrix} O \\ I \\ T^x \\ T^y \end{bmatrix} \quad (7)$$

with zero matrix 0 and identity matrix I. The identity matrix I of check matrix column C yields a syndrome Syn=H×W that preserves an error pattern of a received word W, because the product of the error pattern and the identity matrix I is the error pattern itself. The zero matrix 0 and the rotation of check matrix columns C yields a syndrome Syn for which the portion that describes the error pattern may be readily identified. The product of any pattern and the zero matrix 0 is 0, so the portion after the 0 bits describes the error pattern.

A check matrix H that satisfies the rules defined at step 204 is generated from the check matrix columns C at step 214. Check matrix H may be generated from the check matrix columns C according to Equation (8):

$$H=[C_1 C_2 \ldots C_q] \quad (8)$$

Check matrix H is validated by matrix validator 98 at step 216. Validation of check matrix H may include verifying the following. Set A comprises syndromes produced by a set S of single symbol errors, and set B comprises syndromes produced by a set D of double symbol errors. Set A and set S have a unique one-to-one mapping, but set B and set D do not have a one-to-one mapping. Furthermore, set A and B are disjoint. Validation may include dividing check matrix H into a number of portions, for example, four portions, and simultaneously validating each portion.

If check matrix H is not valid at step 218, the method proceeds to step 219, where check matrix generator 90 records invalid submatrices of check matrix H that do not satisfy error correction and error detection capabilities. According to the rules defined at step 204, a check matrix H that includes a submatrix that does not satisfy these capabilities does not satisfy the rules. The method returns to step 210, where check matrix generator 90 selects primitive elements $T_i$.

If check matrix H is a valid matrix at step 218, the method proceeds to step 220, where weight calculator 96 calculates the weight of check matrix H. At step 222, check matrix generator 90 determines whether check matrix H is the lightest check matrix H that has been generated. If check matrix H is not the lightest, the method proceeds to step 224, where check matrix H is discarded. If check matrix H is the lightest, the method proceeds to step 226, where check matrix H is stored in database 86.

At step 288, check matrix generator 90 determines whether there is a next iteration. The number of iterations may be predetermined. The number may be based on whether the weight of check matrix H is sufficiently decreasing. If the weight has stabilized such that each iteration does not produce a significantly lighter check matrix H, the iterations may cease. If there is a next iteration, the method returns to step 210, where primitive elements $T_i$ are selected. If there is no next iteration, the method proceeds to step 230, where check matrix generator 90 reports the stored check matrix H. The reported check matrix may be described by Equations (9) through (11):

$$H=[R, I_{16 \times 16}] \quad (9)$$

where $$R = \begin{bmatrix} II & OO & H2 & H1 \\ H1 & II & OO & H2 \\ H2 & H1 & II & OO \\ OO & H2 & H1 & II \end{bmatrix} \quad (10)$$

and $$OO=[OOOOOOOO]$$

$$II=[I\ I\ I\ I\ I\ I\ I\ I]$$

$$H_2=[T_3\ T_4 T_8 T_{10}\ T_{12}\ T_{11}\ T_1\ T_{13}\ T_{14}]$$

$$H_2=[T_{14}\ T_{10}\ T_1\ T_5\ T_3\ T_6\ T_2\ T_{13}\ T_7] \quad (11)$$

After reporting check matrix H, the method terminates.

An example check matrix H generated according to the method is described. Example check matrix H comprises a sixteen row matrix. Due to space limitations, a row of check matrix H may occupy more than one line of text.

| Row | Entries |
|---|---|
| 1 | 1000100010001000100010001000100010000000000000000000000000000000 0000000001100101100010011010001100010111011010001010011111100 100111101010001000111000000000000000 |
| 2 | 0100010001000100010001000100010010000000000000000000000000000000 0000000000010111010011010011001100101001100011011100101101000010 11010001011100111010010000000000000000 |
| 3 | 0010001000100010001000100010001000010000000000000000000000000000 00000000000011111010011010011101010011000010101000011110000001 0110100010111001110100100000000000000 |
| 4 | 0001000100010001000100010001000100010000000000000000000000000000 00000000010000111001001101001110101001100101000101001111101000 0011110001010100011000010000000000000 |
| 5 | 0001010011111100100111101010001000110001000100010001000100010010 00100010000000000000000000000000000000000000011001011000100011 010001100010111011010000100000000000 |

-continued

| Row | Entries |
|---|---|
| 6 | 10010110100000101101000101110011101001000100010001000100010001 00010001000000000000000000000000000000000000010111010011010 01100101001100011011000001000000000 |
| 7 | 01000011110000010110100010111001110100100010001000100010001000 10001000100000000000000000000000000000000000001111101001101 00111010100110001010000001000000000 |
| 8 | 00101001111010000011110001010100011000100010001000100010001000100 01000100010000000000000000000000000000000010000111001001100 10011101010011001010000000100000000 |
| 9 | 110010110001001010001000101110110101000101001111110010011110101 000100001110001000100010001000100010001001000100000000000000 0000000000000000000000000010000000 |
| 10 | 00101110100110100110010010011000110111100101101000001011010001011 110011101001000100010001000100010001000100001000000000000000000 00000000000000000000000001000000 |
| 11 | 00011111010011010011101010011000010101000011110000010110100010 1110011101001000100010001000100010001000100001000000000000000000 00000000000000000000001001000000 |
| 12 | 100001110010011010011101010011001010001010011111010000011110001 010100011000100010001000100010001000100010001000100000000000000000 00000000000000000000000000000010000 |
| 13 | 00000000000000000000000000000000011001011000100110100011000 101110110100010100111111001001111010100010001110001000100001000 10001000100010010000000000000001000 |
| 14 | 00000000000000000000000000000000000101110100110100110010100 11000110111001011010000010110100010111001110100100010001000100 01000100010001000100000000000000100 |
| 15 | 0000000000000000000000000000000000011111010010011010011101010 011000010101000011110000010110100010111001110100100010001000100010 0010001000100010001000000000000000010 |
| 16 | 0000000000000000000000000000000000000010000111001001101001110101 0011001010001010011111010000011110001010100011000100010001000100 001000100010001000100000000000000001 |

Check matrix H, however, is only an example. Other check matrices H may be generated according to the method.

Figure 6:
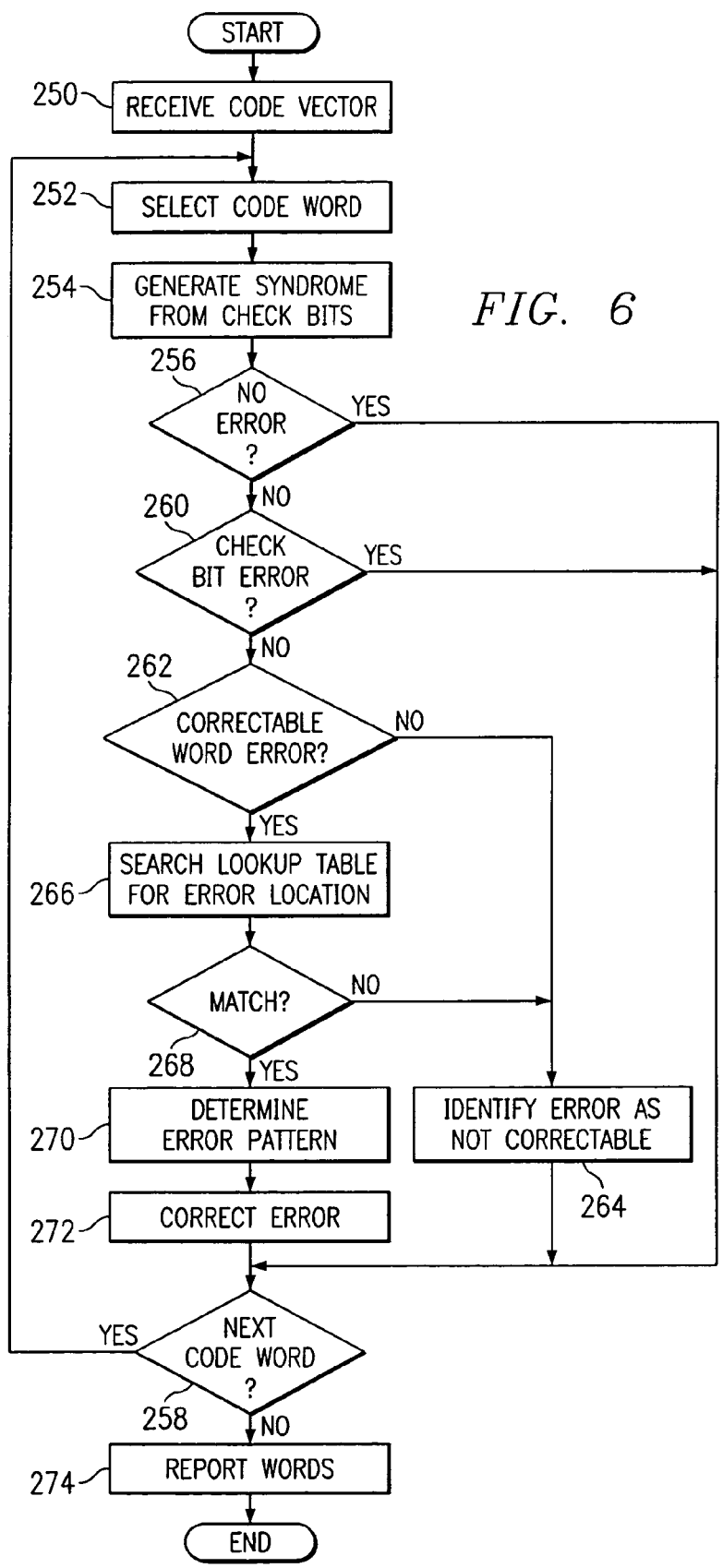
FIG. 6 is a flowchart illustrating one example of a method for detecting and correcting errors.

FIG. 6 is a flowchart illustrating one example of a method for detecting and correcting errors. The method begins at step 250, where a code vector that includes code words W comprising words and associated check bits is received. Each word comprises word symbols. A word may comprise any number of word symbols organized in any number of symbol sets, and may comprise any number of bits, for example, 160 bits. Check bits may comprise any number of check bit sets. In the illustrated example, a word comprises four symbol sets, where each symbol set comprises, for example, nine word symbols. The check bits comprise four check bit sets, each comprising a check bit symbol. The word symbols are labeled 0 through 35, and their associated check bit sets are labeled 36 through 39. The symbols of code vector may be rearranged in order to separate the code words W. A code word W is selected at step 250.

A syndrome vector Syn is generated from the check bits of the selected code word at step 254. Syndrome vector Syn may be calculated using Equation (12):

$$\text{Syn} = H \times W \quad (12)$$

In the illustrated example, a syndrome vector Syn comprises sixteen bits that may be partitioned into four four-bit vectors, as described by Equation (13):

$$\text{Syn} = [S_0\ S_1\ S_2\ S_3]^T \quad (13)$$

Syndrome vector Syn as expressed by Equation (13) may have the following properties:
(a) if there is a single bit error in the first symbol set, then:
  (1) $S_0$ describes the error pattern, so $S_0 \neq 0$;
  (2) $S_3 = 0$; and
  (3) if ($S_1 = 0$), then ($S_2 = 0$), and vice versa. Accordingly, syndrome vector Syn includes an error pattern that may be used to correct an error.
(b) if $[S_0\ S_1\ S_2\ S_3]^T$ is a single symbol error syndrome of the first symbol set, then:
  (1) $[S_3\ S_0\ S_1\ S_2]^T$ is a single symbol error syndrome of the second symbol set;
  (2) $[S_2\ S_3\ S_0\ S_1]^T$ is a single symbol error syndrome of the third symbol set; and
  (3) $[S_1\ S_2\ S_3\ S_0]^T$ is a single symbol error syndrome of the fourth symbol set.
(c) A single symbol error syndrome for the check bit sets 36, 37, 38, and 39, relabeled here i=0, 1, 2, and 3, respectively, yields $S_i \neq 0$, $S_j = 0$, where $0 \leq j \leq 3$, $j \neq i$. Accordingly, syndrome vector Syn of this form may be used to identify errors in the check bit sets.
d) The $[S_1\ S_2]$ for a single symbol error in the first symbol set are unique. Accordingly, these vectors may be used in a lookup table to identify a symbol with an error.

These properties are due in part to the definition of check matrix columns C, as described with reference to FIG. 5. For example, with regard to the properties described in section (a), the zero matrix 0 of check matrix column C yields the zero bits $S_3 = 0$. As discussed previously, the portion of the syndrome after the zero bits, in this case $S_0$, describes the error pattern.

Whether the code word is error free is determined from syndrome vector Syn at step 256. If syndrome vector Syn=$[S_0\ S_1\ S_2\ S_3]$=[0 0 0 0], there is no error in the code word. If there is no error, the method proceeds to step 258 to determine if there is a next code word. If there is an error, the method proceeds to step 260. Whether there is only a check bit error is determined at step 260. The properties of syndrome vector Syn described in section (c) above provides for syndrome vectors Syn that may be used to identify check bit errors. TABLE 1 illustrates an example of syndrome vectors that may be used to identify check bit errors.

TABLE 1

| Received | | | | Error in Check |
|---|---|---|---|---|
| $S_o$ | $S_1$ | $S_2$ | $S_3$ | Bit Set |
| 1 | 0 | 0 | 0 | 36 |
| 0 | 1 | 0 | 0 | 37 |
| 0 | 0 | 1 | 0 | 38 |
| 0 | 0 | 0 | 1 | 39 |

In TABLE 1, "0" represents a zero vector, and "1" represents a non-zero vector. According to TABLE 1, syndrome vector Syn=[1 0 0 0] indicates that there is an error in check bit set 36. Syndrome vector Syn may be rewritten as Syn=<non-zero vector, zero vector$_1$, zero vector$_2$, zero vector$_3$>. For example, Syn=[1 0 0 0] may be rewritten as Syn=<$S_0$, $S_1$, $S_2$, $S_3$>. If there is only a check bit error at step 260, the method proceeds to step 258 to determine if there is a next word. Since check bit errors do not affect the data transmitted in the word, check bit errors are typically not corrected. If there is an error other than a check bit error at step 260, the method proceeds directly to step 262.

Whether there is a correctable word error is determined at step 262. The properties of syndrome vector Syn described in section (a) above provides for syndrome vectors Syn that include error patterns. TABLE 2 illustrates an example of syndrome patterns that may be used to identify correctable word errors.

TABLE 2

| Received | | | | Error in Symbol Set | Lookup Table | Error Pattern |
|---|---|---|---|---|---|---|
| $S_0$ | $S_1$ | $S_2$ | $S_3$ | | | |
| 1 | 1 | 1 | 0 | $1^{st}$ | [$S_1 S_2$] | $S_0$ |
| 0 | 1 | 1 | 1 | $2^{nd}$ | [$S_2 S_3$] | $S_1$ |
| 1 | 0 | 1 | 1 | $3^{rd}$ | [$S_3 S_0$] | $S_2$ |
| 1 | 1 | 0 | 1 | $4^{th}$ | [$S_0 S_1$] | $S_3$ |

According to TABLE 2, syndrome vector Syn=[1 1 1 0] indicates that there may be an error in the first symbol set. Vector [$S_1$ $S_2$] is used to identify the symbol of the first symbol set that has the error. Vector $S_0$ describes the error pattern of the symbol. Syndrome vector Syn may be rewritten as Syn=<error pattern, lookup table$_1$, lookup table$_2$, zero vector>. For example, Syn=[1 1 1 0] may be rewritten as Syn=<$S_0$, $S_1$, $S_2$, $S_3$>. In the illustrated example, a received symbol that is not listed in TABLE 1 does not describe a correctable word error.

If the error is not a correctable word error at step 262, the method proceeds to step 264 to identify the error as not correctable. If the error is a correctable word error, the method proceeds to step 266 to search a lookup table to identify the word symbol of the symbol set that includes the error. A portion of the syndrome vector Syn is used to perform this search. For example, for Syn=[1 1 1 0], vector [$S_1$ $S_2$] is used.

The properties described in section (d) allow for a search using only a portion of the syndrome, which may provide for a smaller lookup table and more efficient searches. In the illustrated example, a symbol set has nine symbols, so the lookup table may be organized into nine parts, each representing a symbol. Each part may produce a value, for example, a one representing the presence of an error in a symbol of a symbol set or a zero representing the absence of an error in the symbol. If there is a match at step 268, the lookup table output identifies the symbol with the error, and the method proceeds to step 270. If there is no match at step 268, the error is not correctable, and the method proceeds to step 264 to identify the error as not correctable.

The error pattern is determined from the syndrome at step 270. According to the properties of syndrome vector Syn as described in section (a), the syndrome vector includes the error pattern. For example, as shown in TABLE 1, syndrome vector Syn=[1 1 1 0] includes vector $S_0$ that describes the error pattern of the error present in the symbol identified at step 266.

The error is corrected at step 272. The symbol set identified using TABLE 2 at step 262 and the symbol of the symbol set identified by the lookup table at step 266 are used to determine the location of the error. The error pattern determined at step 270 describes how to correct the error. The error may be corrected by performing an exclusive-or (XOR) operation on the error pattern and the word symbol identified as having the error.

At step 258, if there is a next code word W of the code vector, the method returns to step 250 to select the next code word W. If there is no next code word W, the method proceeds to step 264, where the words are outputted. After outputting the words, the method terminates.

Transmitting and Receiving Word Symbols

Figure 7:
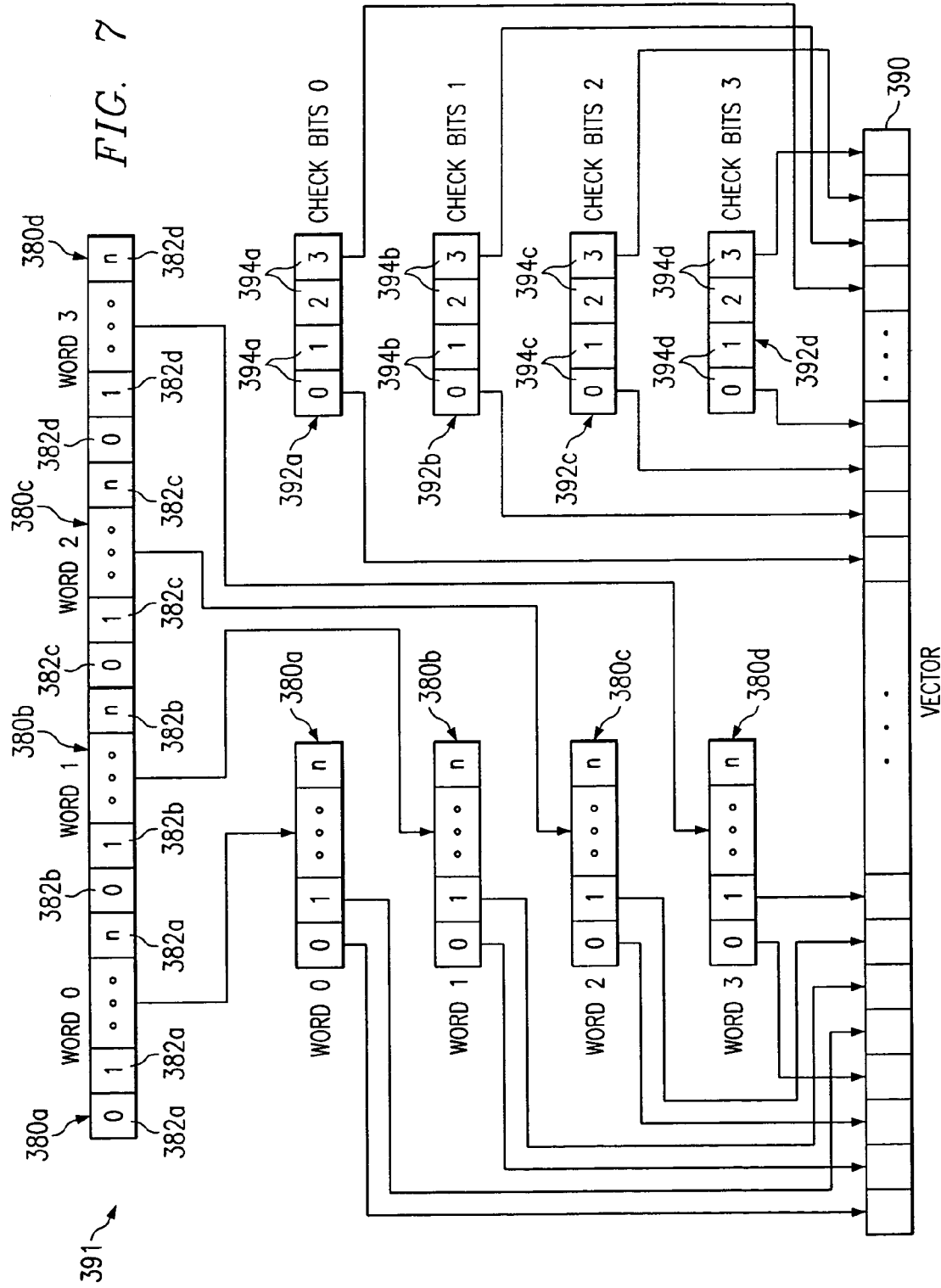
FIG. 7 is a diagram illustrating examples of words comprising a number of word symbols that are inserted into a vector.

FIG. 7 is a diagram illustrating examples of words 380 comprising a number of word symbols 382 that are inserted into a vector 390. Check bits 392 comprising a number of check bit symbols 394 are calculated for each word 380 and inserted into vector 390. A code word 391 includes a word 380 and check bits 392.

A word 380 may comprise any suitable number of any suitable size of word symbols 382. For example, word 380 may comprise 36 four-bit word symbols 382, which may be indexed from 0 through 35, starting from the most significant bit. Check bits 392 may comprise any suitable number of any suitable size of check bit symbols 394. For example, check bits 392 for a word 380 may comprise four four-bit check bit symbols 394. Vector 390 may comprise any suitable number of code words 391, for example, four code words 391.

In the illustrated example, the first word symbol 382, labeled symbol 0, of each word 380 is inserted into vector 390 to be transmitted. Symbol 0 of word 0 is inserted, then symbol 0 of word 1 is inserted, and so on. Next, the second word symbol, labeled symbol 1, of each word 380 is inserted in a similar manner. Word symbols 382 are inserted into vector 390 until the last word symbol, labeled symbol n, of each word 380 has been inserted. After inserting word symbols 382, check bit symbols 394 of check bits 392 are inserted. Check bit symbols 394 may be inserted into vector 390 using a procedure substantially similar to the procedure used for inserting word symbols 382 into vector 390.

Rearranging word symbols 382 from a number n of words 380 and inserting word symbols 382 into vector 390 allows for correction of errors in n sequential symbols of vector 390. In the illustrated example, word symbols 382 from four words 380 are inserted into vector 390. Errors in up to four sequential word symbols 382 of vector 390 may be corrected, since each word symbol 382 belongs to a different word 380 having its own set of check bits 392. The set of check bits associated with the word symbol 382 may be used to correct the error in the word symbol 382.

Figure 8:
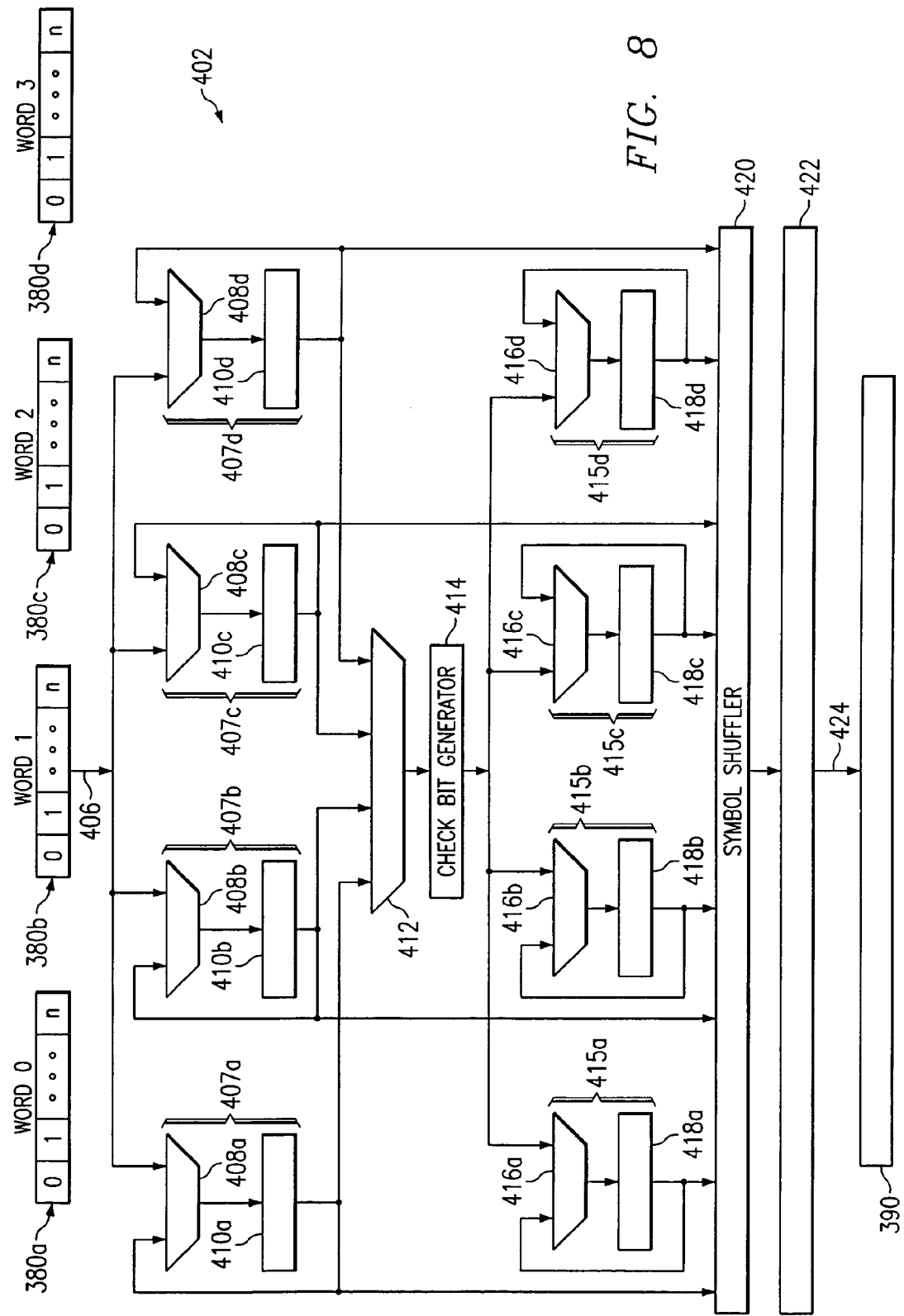
FIG. 8 is a block diagram of one example of a system for generating a vector from a serial sequence of words.

FIG. 8 is a block diagram of one example of a system 402 for generating a vector 390 from a number of words 380. An input 406 receives a serial sequence of words 380. Latches 407 that each receive a word 380 are coupled to input 406. The number of latches 407 may be equivalent to the number of words 380 that are inserted into vector 390. A latch 407 includes a multiplexer 408 and a buffer 410 that stores a word 380. Latches 407 may send words 380 one at a time to multiplexer 412 during on-chip cycles.

A multiplexer 412 is coupled to buffers 410. A check bit generator 414 coupled to multiplexer 412 generates check bits for words 380. The arrangement of latches 407, multiplexer 412, and check bit generator 414 may provide for parallel check bit generation for a serial sequence of words 380. Any suitable arrangement, however, may be used. Latches 415 are coupled to check bit generator 414. The number of latches 415 may be equivalent to the number of words 380 that are inserted into vector 390. A latch 415 includes a multiplexer 416 and a buffer 418 that stores check bits generated for a word 380. A symbol shuffler 420 coupled to buffers 410 and to buffers 418 arranges and inserts word symbols 382 and check bit symbols 394 into vector 390. A buffer 422 stores vector 390, and an output 424 coupled to buffer 422 outputs vector 390.

Figure 9:
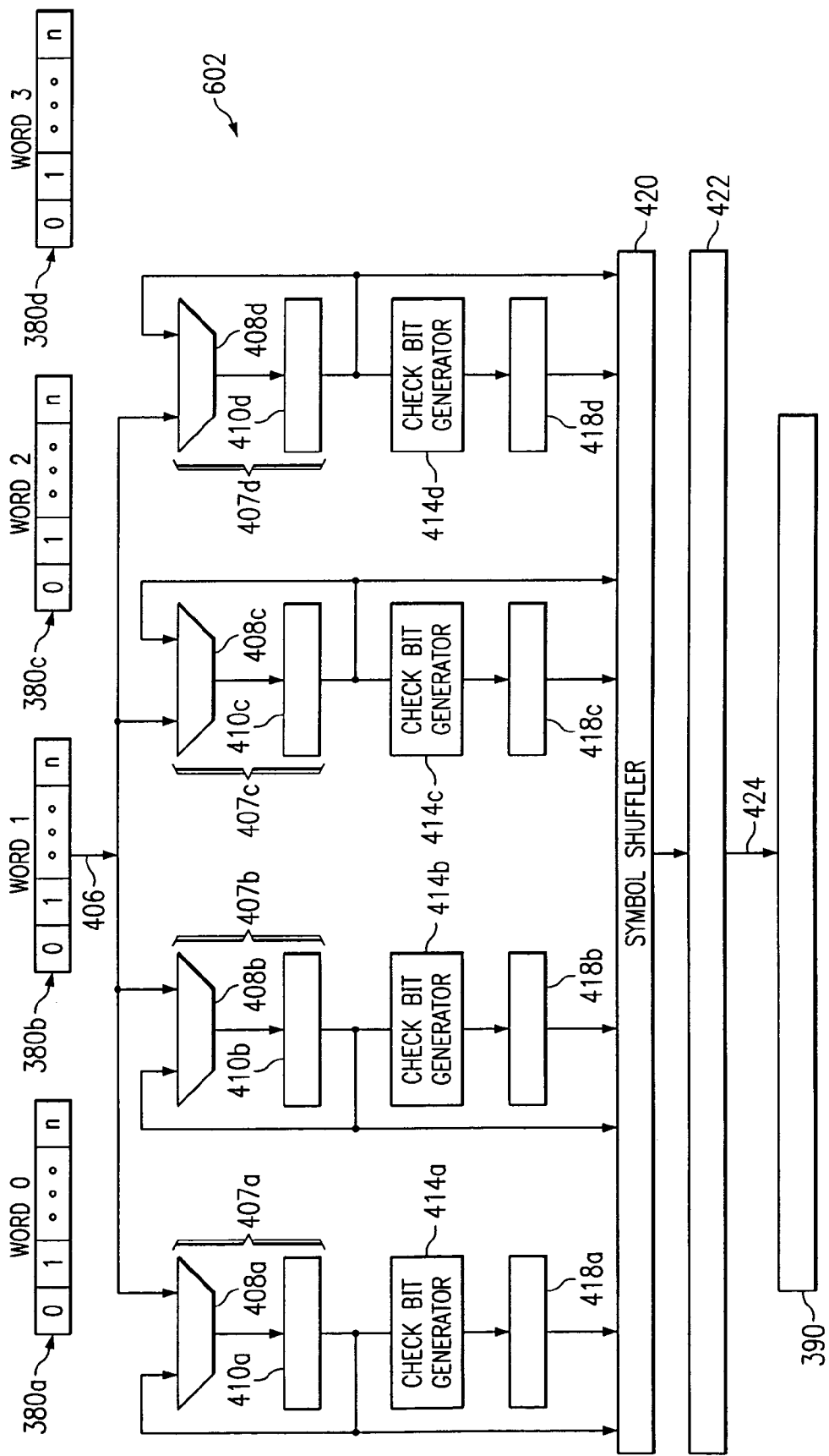
FIG. 9 is a block diagram of one example of a pipelined system for generating a vector from a serial sequence of words.

FIG. 9 is a block diagram of one example of a pipelined system 602 for generating a vector 390 from a number of words 380. An input 406 receives a serial sequence of words 380. Latches 407 that each receive a word 380 are coupled to input 406. The number of latches 407 may be equivalent to the number of words 380 that are inserted into vector 390. A latch 407 includes a multiplexer 408 and a buffer 410 that stores a word 380.

Check bit generators 414 are coupled to latches 407. A check bit generator 414 generates check bits for words 380. The arrangement of latches 407 and check bit generators 414 may provide for pipelined check bit generation for a serial sequence of words 380. Any suitable arrangement, however, may be used. A buffer 418 that stores check bits generated for a word 380 is coupled to each check bit generator 414. A symbol shuffler 420 coupled to buffers 410 and to buffers 418 arranges and inserts word symbols 382 and check bit symbols 394 into vector 390. A buffer 422 stores vector 390, and an output 424 coupled to buffer 422 outputs vector 390.

FIG. 10 is a flowchart illustrating one example of a method for generating vector 390 from a serial sequence of words 380 that may be used with system 402 of FIG. 8. A similar method may be used with system 602 of FIG. 9. The method begins at 440, where input 406 receives a serial sequence of words 380. Check bits are generated for each word 380 by check bit generator 414 at step 442. Steps 446 through 460 may be performed by symbol shuffler 420. A word 380 is selected at step 446. For example, a first word 380 of the sequence, labeled word 0, is selected. A word symbol 382 of the selected word 380 is inserted into vector 390 at step 448. For example, a first word symbol, labeled symbol 0, of word 0 is inserted into vector 390.

At step 450, symbol shuffler 420 determines whether the selected word 380 is the last word 380 of the sequence of words 380. If the selected word 380 is not the last word 380, the method returns to step 446, where a next word 380 of the sequence of words 380 is selected. If the selected word 380 is the last word 380 of the sequence, the method proceeds to step 452. At step 452, symbol shuffler 420 determines whether the last word symbol 382 of the last word 380 has been inserted into vector 390. If the last word symbol 382 has not been inserted, the method proceeds to step 453 to reset the sequence of words 380 such that the next iteration starts at the first word 380 of the sequence. The method then returns to step 446, where the first word 380 of the sequence is selected. If the last word symbol 382 has been inserted, the method proceeds to step 454.

Symbol shuffler 420 selects a word 380 of the sequence such as the first word 380 of the sequence at step 454. A check bit symbol 392 such as the first check bit symbol 392 of the selected word 380 is inserted into vector 390 at step 456. At step 458, symbol shuffler 414 determines whether the selected word 380 is the last word 380 of the sequence. If the selected word 380 is not the last word 380, the method returns to step 454, where the next word 380 is selected. If the selected word 380 is the last word 380 in the sequence, the method proceeds to step 460.

At step 460, symbol shuffler 414 determines whether the last check bit symbol 394 of the last word 380 has been inserted into vector 390. If the last check bit symbol 394 has not been inserted, the method proceeds to step 461, where symbol shuffler 414 resets the sequence of words such that the next iteration begins at the first word 380, for example, word 0. The method then returns to step 454, where the first word 380 of the sequence is selected. If the last check bit symbol 394 has been inserted, the method proceeds to step 462, where output 424 outputs vector 390. After outputting vector 390, the method terminates.

Figure 11:
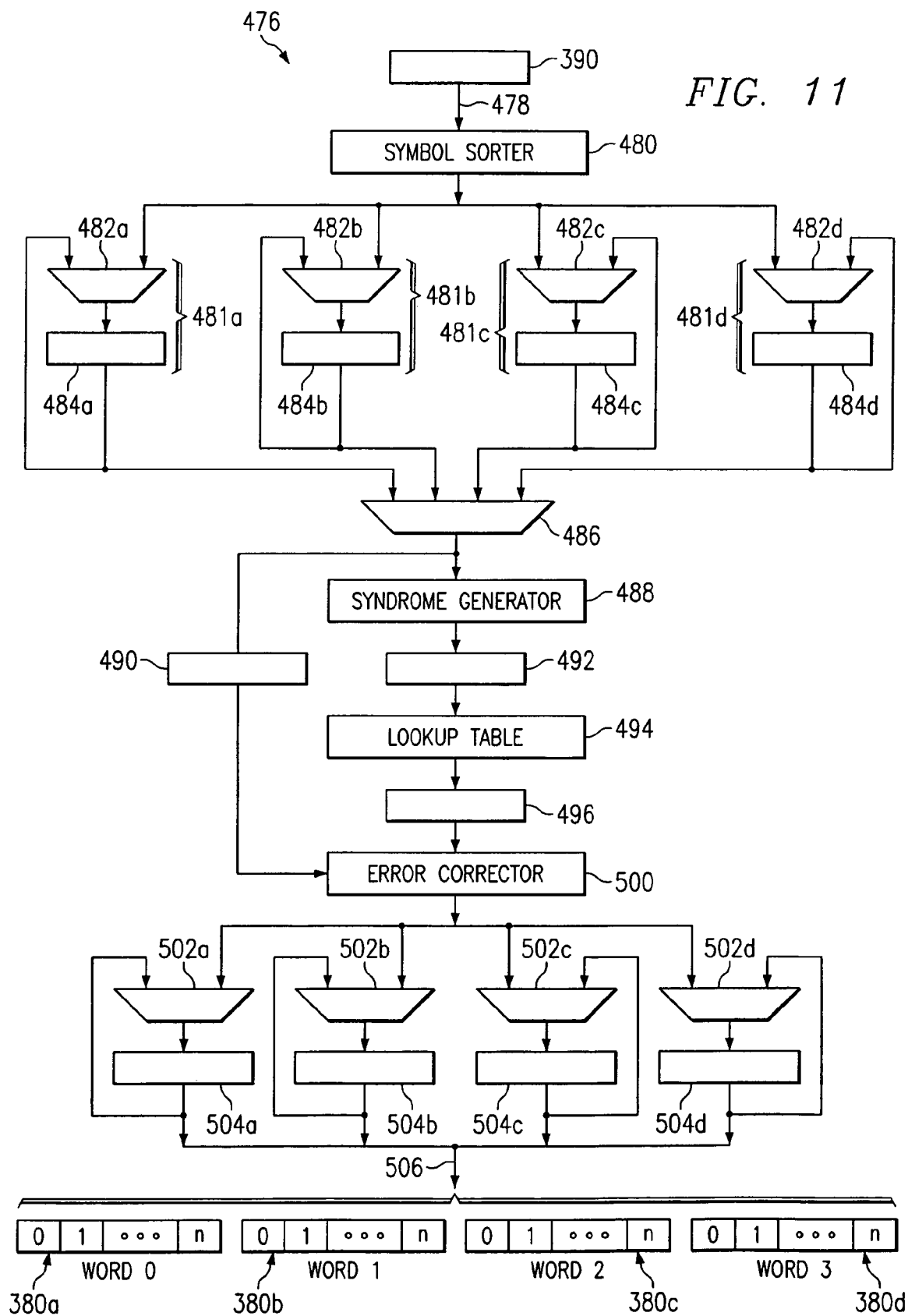
FIG. 11 is a block diagram illustrating one example of a system for generating words from a vector.

FIG. 11 is a block diagram illustrating one example of a system 476 for generating words 380 from vector 390. An input 478 receives vector 390. A symbol sorter 480 coupled to input 478 rearranges the symbols of vector 390 to form code words 391, where each code word comprises a word 380 and check bits 392. Latches 481 comprising multiplexers 482 and buffers 484 are coupled to symbol sorter 480. The number of latches 481 may be equivalent to the number of code words 391 of vector 390. A multiplexer 486 is coupled to buffers 484.

A syndrome generator 488 coupled to multiplexer 486 generates a syndrome for a code word 391. Syndrome generator 488 may generate a syndrome for a word 380 using check bits 392 associated with the word 380. The arrangement of latches 481, multiplexer 486, and syndrome generator allows for parallel generation of syndromes. Any suitable arrangement, however, may be used. A buffer 490 coupled to multiplexer 486 stores words 380, and a buffer 492 coupled to syndrome generator 488 stores generated syndromes.

A lookup table 494 coupled to buffer 492 is used with the syndrome to determine which word symbol 382 may need correction. A buffer 496 is coupled to lookup table 494. An error corrector 500 coupled to buffer 490 and to buffer 496 corrects errors found in a word 380 using an error pattern included in the syndrome associated with the word 380. Multiplexers 502 are coupled to error corrector 500, and a buffer 504 operable to store a corrected word is coupled to each multiplexer 502. An output 506 coupled to buffers 504 outputs words 380.

In the illustrated example, system 476 includes syndrome generator 488, lookup table 494, and error corrector 500 shared by four words 380 that form vector 390. The latency to generate four words 380 from vector 390 may be six cycles. System 476 may support ten Gbps with minimal components by, for example, utilizing a clock speed of at least one cycle per ten nanoseconds.

Figure 12:
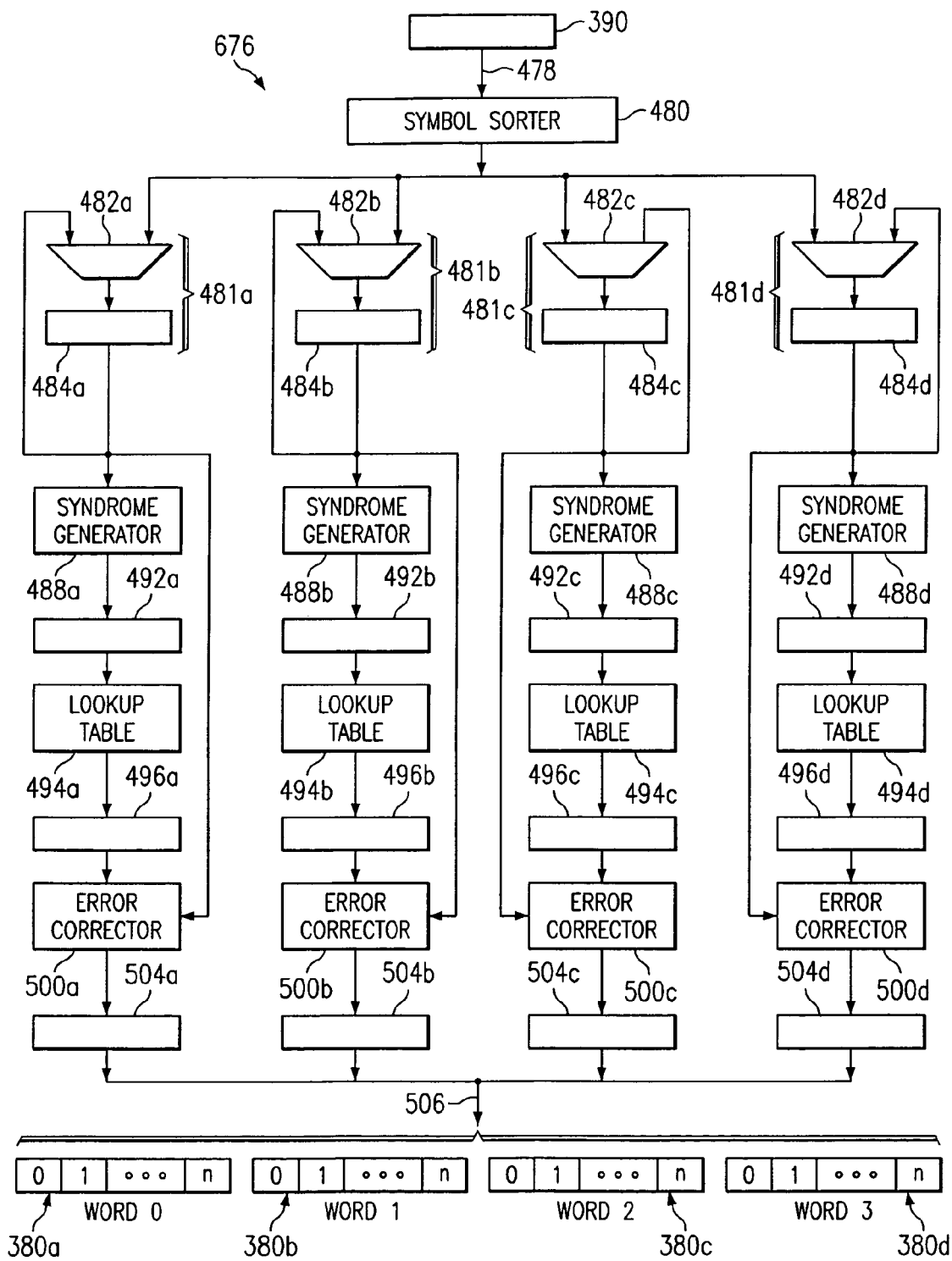
FIG. 12 is a block diagram illustrating one example of a pipelined system for generating words from a vector.

FIG. 12 is a block diagram illustrating one example of a pipelined system 676 for generating words 380 from vector 390. An input 478 receives vector 390. A symbol sorter 480 coupled to input 478 rearranges the symbols of vector 390 to form code words 391, where each code word comprises a word 380 and check bits 392. Latches 481 comprising multiplexers 482 and buffers 484 are coupled to symbol sorter 480. The number of latches 481 may be equivalent to the number of code words 391 of vector 390.

Syndrome generators 488 are coupled to latches 481. A syndrome generator 488 generates a syndrome for a code word 391 using check bits 392 associated with the word 380 of code word 391. A buffer 492 that stores generated syndromes is coupled to each syndrome generator 488. Lookup tables 494 are coupled to buffers 492. A lookup table 494 is used with the syndrome to determine which word symbol 382 may need correction. A buffer 496 is coupled to each lookup table 494. Error correctors 500 are coupled to buffers 496. An error corrector 500 corrects errors found in a word 380 using an error pattern included in the syndrome associated with the word 380. A buffer 504 is coupled to each error corrector 500. The arrangement of syndrome generators 488, lookup tables 494, and error correctors 500 allows for parallel generation of words 380. Any suitable arrangement, however, may be used. An output 506 coupled to buffers 504 outputs words 380.

In the illustrated example, system 676 includes a syndrome generator 488, a lookup table 494, and an error corrector 500 for each word 380 that forms vector 390. The latency to generate four words 380 from vector 390 may be three cycles. System 476 may support 40 Gbps by, for example, utilizing a clock speed of at least one cycle per sixteen nanoseconds.

FIG. 13 is a flowchart illustrating one example of a method for generating words 380 from vector 390 that may be used with system 476 of FIG. 10. A similar method may be used with system 676 of FIG. 12. The method begins at step 520, where input 478 receives vector 390. Symbol sorter 480 sorts the symbols of vector 390 into code words 391 at step 522.

A code word 391 is selected at step 524. Syndrome generator 488 generates a syndrome for the selected code word 391 at step 526. The syndrome may comprise 16 bits. At step 528, lookup table 494 is used to identify a word symbol 382 that may need correction. All or part, such as 8 bits, of the syndrome may be used to identify word symbol 382 with an error. If there is an error, the method proceeds to step 530, where error corrector 500 performs error correction using an error pattern included in the syndrome.

If there is no error, the method proceeds directly to step 532, where system 10 determines whether there is a next code word. If there is a next code word 391, the method returns to step 524, where the next code word 391 is selected. If there is no next code word 391, the method proceeds to step 534, where output 506 outputs words 380. After outputting words 380, the method terminates.

Although an embodiment of the invention and its advantages are described in detail, a person skilled in the art could make various alterations, additions, and omissions without departing from the spirit and scope of the present invention as defined by the appended claims.

What is claimed is:

1. A method for performing error correction, comprising:
receiving a vector including shuffled symbols from a plurality of code words;
rearranging the shuffled symbols to form a code word comprising a word and a plurality of check bits, the word comprising a plurality of symbols;
generating a syndrome from the check bits, the syndrome comprising an error pattern;
identifying a symbol of the word having an error; and
correcting the error of the symbol according to the error pattern.

2. The method of claim 1, further comprising:
generating the code word by multiplying the word and a generation matrix; and
transmitting the code word.

3. The method claim 1, wherein identifying the symbol having the error comprises:
selecting a portion of the syndrome; and
searching a lookup table according to the portion to identify the symbol.

4. The method of claim 1, wherein correcting the error of the symbol according to the error pattern comprises performing an exclusive-or operation on the symbol and the error pattern.

5. The method of claim 1, further comprising identifying a check bit having an error.

6. The method of claim 1, wherein generating a syndrome from the check bits comprises generating the syndrome using a check matrix comprising sixteen rows comprising:

| Row | Entries |
|---|---|
| 1 | 1000100010001000100010001000100010000000000000000000000000000000000000000011001011000100110100011000101110110100010100111111001001111010100010001110000000000000000 |
| 2 | 0100010001000100010001000100010001000100000000000000000000000000000000000000101110100110100110010100110001101110010110100000101101000101110011101001000000000000000 |
| 3 | 0010001000100010001000100010001000100000000000000000000000000000000000000000111110100110100111010100110000101010000111100000101101000101110011101001000000000000000 |
| 4 | 0001000100010001000100010001000100010000000000000000000000000000000000000001000011100100110100111010100110010100010100111101000001111000101010001100001000000000000 |
| 5 | 0001010011111100100111101010001000111000100010001000100010001000100100100100010000000000000000000000000000000000000000110010110001001101000110001011101101000010000001 |
| 6 | 1001011010000101101000101110011101001000100010001000100010001000100010001000100100000000000000000000000000000000000101110100110100110010100110001101110000010000000000 |
| 7 | 0100001111000001011010001011100111010010001000100010001000100010001000100010000000000000000000000000000000001111101001101001110101001100001010000010000000000 |

-continued

| Row | Entries |
|---|---|
| 8 | 0010100111101000001111000101010001100001000100010001000100010001000100010010001100100110100111010100110010100000000100000000 |
| 9 | 1100101100010011010001100010111011010001010011111100100111101000100011100010001000100010001000100010001000100000000000000000000000000000000000000000010000000 |
| 10 | 001011101001101001100101001100011011100101101000001011010001011100111010010001000100010001000100010001000100010000000000000000000000000000000000000000000001000000 |
| 11 | 000111110100110100111010100110000101010000111100000101101000101110011101001000100010001000100010001000100010001000100000000000000000000000000000000000000000100000 |
| 12 | 10000110010011010011101010011001010001010011110100000111100010101001100001000100010001000100010001000100010001000000000000000000000000000000000000010000 |
| 13 | 00000000000000000000000000000000000000011001011000100110100011000101110110100010100111111001001111010100010001110001000100010001000100010001000000000000000000001000 |
| 14 | 0000000000000000000000000000000000000010111010010100110010100110001101110010110100000101101000101110011101001000100010001000010001000100010000000000000000000100 |
| 15 | 000000000000000000000000000000000000011111010011010011010100110000101010000111100000101110100010111001110100100010001000100010001000100010001000000000000000000010 |
| 16 | 00000000000000000000000000000000000010000111001001101001110101001100101000101001111010000011110001010100011000010001000100010001000100010001000100010001000100000000000001 |

7. A system for performing error connection, comprising:
an input operable to receive a vector including a plurality of shuffled symbols from a plurality of code words;
a symbol sorter operable to rearrange the shuffled symbols to form a code word comprising a word and a plurality of check bits, the word comprising a plurality of symbols;
a syndrome generator coupled to the input and operable to generate a syndrome from the check bits, the syndrome comprising an error pattern;
a lookup table coupled to the syndrome generator and operable to identify a symbol of the word having an error; and
an error corrector coupled to the lookup table and operable to correct the error of the symbol according to the error pattern.

8. The system of claim 7, further comprising:
a check bit generator operable to generate the code word by multiplying the word and a generation matrix; and
an output coupled to the check bit generator and operable to transmit the code word.

9. The system of claim 7, wherein the lookup table is operable to identify the symbol having the error by:
selecting a portion of the syndrome; and
searching a lookup table according to the portion to identify the symbol.

10. The system of claim 7, wherein error corrector is operable to correct the error of the symbol according to the error pattern by performing and exclusive-or operation on the symbol and the error pattern.

11. The system of claim 7, wherein the syndrome generator is operable to identify a check bit having an error.

12. The system of claim 7, wherein the syndrome generator is operable to generate the syndrome using a check matrix comprising sixteen rows comprising:

| Row | Entries |
|---|---|
| 1 | 1000100010001000100010001000100010000000000000000000000000000000000000000011001011000100110100011000101110110100010100111111001001111010100010001110000000000000 |
| 2 | 01000100010001000100010001000100010000000000000000000000000000000000000001011101001101001100101001100011011100101101000001011101000101110011101001000000000000 |
| 3 | 00100010001000100010001000100010001000000000000000000000000000000000000001111010011010011101010011000010101000011110000010110100010111001110100100000000 |
| 4 | 00010001000100010001000100010001000100000000000000000000000000000000000000100001110010011010011101010011001010001010011111010000111100010101001000000000 |
| 5 | 000101001111110010011110101000100011100010001000100010001000100010001000010000000000000000000000011001011000100110100011000101110110100000000000 |
| 6 | 1001011010000101101000101110011101001000100010001000100010001000100010001000100000000000000000000000000000000000000000001011101001101001100101001100110110000010000000000 |

-continued

| Row | Entries |
|---|---|
| 7 | 0100001111000001011010001011100111010010001000100010001000<br>1000100010000000000000000000000000000000000000001111101001101<br>0011101010011000010100000010000000000 |
| 8 | 0010100111101000001111000101010001100001000100010001000100<br>0100010001000000000000000000000000000000000000001000011100100110<br>1001110101001100101000000000100000000 |
| 9 | 1100101100010011010001100010111011010001010011111001001111010<br>1000100011100010001000100010001000100010001000100000000000000<br>000000000000000000000000000010000000 |
| 10 | 0010111010011010011001010011000110111001011010000101101000101<br>110011101001000100010001000100010001000100010001000000000000000<br>000000000000000000000000000001000000 |
| 11 | 000111110100110100111010100110000101010000111100000010110100010<br>11100111010010001000100010001000100010001000100010000000000000<br>00000000000000000000000000000000100000 |
| 12 | 100001100100110100111010100110010100010100111101000001111000<br>010100011000100010001000100010001000100010001000000000000000<br>000000000000000000000000000000010000 |
| 13 | 00000000000000000000000000000001100101100010010110100011000<br>10111011010001010011111100100111101010001000111000100010001000<br>100010001000100010000000000000001000 |
| 14 | 00000000000000000000000000000000010111010011010011001010<br>11000110111001011010000010110100010111001110100100010001000100<br>01000100010001000100000000000000000100 |
| 15 | 0000000000000000000000000000000000000011111010011010011101010<br>011000010101000011110000010110100010111001110100100001000100010<br>001000100010001000100000000000000010 |
| 16 | 0000000000000000000000000000000000001000011100100110100111010101<br>0011001010001010011110100000111100010101000110000100010001000<br>0001000100010001000100000000000000001 |

13. A hardware-based logic for performing error corrections comprising:
a logic embodied in a hardware medium and operable to:
receive a vector including a plurality of shuffled symbols from a plurality of code words;
rearrange the shuffled symbols to form a code word comprising a word and a plurality of check bits, the word comprising a plurality of symbols;
generate a syndrome from the check bits, the syndrome comprising an error pattern;
identify a symbol of the word having an error; and
correct the error of the symbol according to the error pattern.

14. The hardware-based logic of claim 13, wherein the logic embodied in the hardware medium is further operable to:
generate the code word by multiplying the word and a generation matrix; and
transmit the code word.

15. The hardware-based logic of claim 13, wherein the operation to identify the symbol having the error comprises:
selecting a portion of the syndrome; and
searching a lookup table according to the portion to identify the symbol.

16. The hardware-based logic of claim 13, wherein the operation to correct the error of the symbol according to the error pattern comprises:
performing an exclusive-or operation on the symbol and the error pattern.

17. The hardware-based logic of claim 13, wherein the logic embodied in the hardware medium further comprises an operation to:
identify a check bit having an error.

18. The hardware-based logic of claim 13, wherein the syndrome is generated using a check matrix comprising sixteen rows comprising:

| Row | Entries |
|---|---|
| 1 | 1000100010001000100010001000100010000000000000000000000000000<br>00000000001100101100010011010001100010111011010001010011111100<br>1001111010100010001110000000000000 |
| 2 | 0100010001000100010001000100010001000000000000000000000000000000<br>000000000000101110100110100110010100110001101110010110100000010<br>11010001011001110100100000000000000 |
| 3 | 0010001000100010001000100010001000100000000000000000000000000<br>000000000000011111010011010011101010011000010101000011110000001<br>011010001011100111010010000000000000 |
| 4 | 000100010001000100010001000100010001000000000000000000000000000<br>00000000001000011100100110100111010100110010100010100111101000<br>00111100010101000110000100000000000 |
| 5 | 00010100111111001001111010100010001110001000100010001000100010<br>00100010000000000000000000000000000000000001100101100010011<br>0100011000101110110100001000000000000 |

-continued

| Row | Entries |
|---|---|
| 6 | 1001011010000010110100010111001110100100010001000100010001000100001000100000000000000000000000000010111010011010011001010011000110110000010000000000 |
| 7 | 0100001111000001011010001011100111010010001000100010001000100001000100001000100000000000000000000000000000000000001111101001101001110101001100001010000001000000000 |
| 8 | 001010011110100000111100010101000110001000100010010001000100010000010000000000000000000000000000000010000111001001101001110101001100101000000001000000000 |
| 9 | 11001011000100110100011000101110110100010100111111001001111010100010001110001000100010001000100010001000100010000000000000000000000000000000000000000000010000000 |
| 10 | 001011101001101001100101001100110011101110010110100000101101000101110011101001000100010001000100010001000100010001000000000000000000000000000000000000001000000 |
| 11 | 00011111010011010011101010011000010101000011110000010110100010111001110100010001000100010001000100010001000100010000000000000000000000000000000000000000100000 |
| 12 | 10000111001001101001110101001100101000101001111010000011110001010100011000010001000100010001000100010001000100010000000000000000000000000000000000000000010000 |
| 13 | 00000000000000000000000000000000000011001011000100110100011000101110110100010100111111001001111010100010001000111000100010001000100010001000100010001000100010000000000001000 |
| 14 | 0000000000000000000000000000000000000000101110100110100110010100110001101110010110100000101101000101110011101001000100010001000010001000100010001000000000000100 |
| 15 | 0000000000000000000000000000000000000000111110100110100111010100110001010100001111000001011010001011100111010001000100010001000100010001000000000000000010 |
| 16 | 000000000000000000000000000000000000000010000111001001101001110101001100101000101001111010000011110001010100011000010001000100010001000100010001000100010001000000000000001 |

19. A system for performing error correction, comprising:
means for receiving a vector including a plurality of shuffled symbols from a plurality of code words;
means for rearranging the plurality of shuffled symbols to form a code word comprising a word and a plurality of check bits, the word comprising a plurality of symbols;
means for generating a syndrome from the check bits, the syndrome comprising an error pattern;
means for identifying a symbol of the word having an error; and
means for correcting the error of the symbol according to the error pattern.

20. A method for performing error correction, comprising:
generating a code word by multiplying a word and a generation matrix, the code word comprising the word and a plurality of check bits, the word comprising a plurality of symbols;
shuffling the symbols from the code word and one or more other code words;
transmitting a vector including the shuffled symbols;
receiving the vector;
rearranging the shuffled symbols to form the code word;
generating a syndrome from the check bits, the syndrome comprising an error pattern;
identifying a symbol of the word having an error by;
  selecting a portion of the syndrome; and
  searching a lookup table according to the portion to identify the symbol; and
correcting the error of the symbol according to the error pattern by performing an exclusive-or operation on the symbol and the error pattern.

* * * * *

UNITED STATES PATENT AND TRADEMARK OFFICE
CERTIFICATE OF CORRECTION

| | | |
|---|---|---|
| PATENT NO. | : 7,539,929 B1 | Page 1 of 1 |
| APPLICATION NO. | : 11/154886 | |
| DATED | : May 26, 2009 | |
| INVENTOR(S) | : Ulrich Stern et al. | |

It is certified that error appears in the above-identified patent and that said Letters Patent is hereby corrected as shown below:

Column 3, line 3, delete "$p_m.]$" and insert --$p_m]$.--, therefor.
Column 8, line 22, delete "$H=[R,I_{16\times16]}$" and insert --$H=[R,I_{16\times16}]$--, therefor.
Column 8, line 39, delete "$H_2$" and insert --$H_1$--, therefor.
Column 11, Table 1, delete "$S_o$" and insert --$S_0$--, therefor.
Column 17, line 29, in claim 7, delete "connection," and insert --correction,--, therefor.
Column 18, line 40, in claim 10, after "performing" delete "and" and insert --an--, therefor.
Column 19, lines 31-32, in claim 13, delete "corrections" and insert --correction,--, therefor.

Signed and Sealed this

Eighteenth Day of May, 2010

David J. Kappos
*Director of the United States Patent and Trademark Office*